United States Patent [19]

Brooks

[11] Patent Number: 5,477,420
[45] Date of Patent: Dec. 19, 1995

[54] INTERIOR CIRCUIT BOARD SUPPORTS AND METHOD

[75] Inventor: John J. Brooks, Santa Ynez, Calif.

[73] Assignee: Santa Barbara Research Center, Goleta, Calif.

[21] Appl. No.: 330,503

[22] Filed: Oct. 28, 1994

[51] Int. Cl.⁶ .................................................. H05K 7/14
[52] U.S. Cl. .................... 361/796; 361/752; 361/756; 361/758; 361/788; 361/802; 361/804; 361/807; 439/64; 29/592.1; 211/41
[58] Field of Search .................... 361/735, 741–742, 361/752, 758, 796, 801–802, 804, 807, 809, 810; 174/152 G, 153 G; 439/55, 64; 29/592.1; 211/41

[56] References Cited

U.S. PATENT DOCUMENTS

| 4,327,835 | 5/1982 | Leger | 211/41 |
| 5,390,083 | 2/1995 | Decker et al. | 361/796 |

OTHER PUBLICATIONS

"Heat Sink/Dissipator Products and Thermal Management Guide," by IERC, Inc., Burbank Calif., Sec. 7, p. 10, 1984.

*Primary Examiner*—Bot L. Ledynh
*Attorney, Agent, or Firm*—W. C. Schubert; W. K. Denson-Low

[57] ABSTRACT

Interior circuit card supports and a method that facilitate fast and simple Assembly and disassembly of the circuit cards, and provide both interior and peripheral card support, are disclosed. A plurality of circuit cards 32a–32n, each having at least one interior hole 36, are positioned substantially parallel to each other with the holes of the various cards collinear. A plurality of grommets 38 are secured in the holes, with each grommet providing a first coupling. A rod 42 having a plurality of second couplings 44 is inserted through the grommets such that the second couplings mate with the grommets' first couplings to provide an interior support that maintains the spacing between the circuit cards. In the preferred embodiment the grommets are internally threaded with a groove that extends their entire length, and the rod has deformable inserts that form an interference fit with the grommets' threads. The rod is inserted and then rotated, causing the inserts to deform and grip the threads.

15 Claims, 2 Drawing Sheets

1

INTERIOR CIRCUIT BOARD SUPPORTS AND METHOD

BACKGROUND OF THE INVENTION

1. Field of the Invention

The present invention generally relates to interior supports and a method for providing interior structural supports for a stack of circuit cards.

2. Description of the Related Art

Circuit cards or boards can be tightly stacked one on top of another inside computers, airplanes, spacecraft or electronic devices in general to conserve space and shorten the lead lengths between components on separate cards. The circuit cards are typically plugged into a backplane that holds them parallel to each other and facilitates communications between the individual cards. The cards' interior portions can sag under their own weight or deflect in response to vibrations at their resonant frequencies, and thus create stress on the circuit components and leads. The circuit card deflection increases as the card becomes larger because of greater sag and a lower resonant frequency. These problems complicate and increase the cost of design by forcing engineers to incorporate structural as well as functional considerations into their designs. For example, the heavier components may have to be placed along the periphery of the circuit cards.

An electronics module can be used to hold a number of circuit cards in close proximity and to electrically connect the cards. The electronics module is a metal box that is open at one end and has a backplane at the other end. Locking circuit card guides are installed on opposing side walls. A suitable card guide is disclosed in "Heat Sink/Dissipator Products and Thermal Management Guide," by IERC, Inc. of Burbank, Calif. sect. 7, p. 10, 1984. The locking guides include a pair of tracks that support the circuit cards and respective camshafts that can be rotated Go pinch down and hold respective cards. The circuit cards are slid into successive tracks and plugged into the backplane, which facilitates communication between the individual cards. When the cards are in place, the guides are locked by rotating the camshafts such that each circuit card is supported on three sides by the guides and backplane, and separated from the adjacent cards by about 1.25 cm–1.9 cm (by ½" to ¾"). Other card guides use different mechanisms to clasp the circuit cards' edges. Card guides improve the cards' peripheral support, but the lack of interior support can cause stress in the electrical components and complicate the card design.

FIG. 1 is a sectional view of a conventional approach that uses stand-offs 21 to provide interior structural support between circuit cards 22 to reduce sagging and deflection. The circuit cards 22 are plugged into a backplane 24, which electrically connects the cards and holds them parallel to each other. One type of stand-off 21 includes an internally threaded sleeve 26 and two screws 28 that can be threaded into the sleeve's opposite ends. The circuit cards are fabricated with complimentary hole patterns such that in each card half of the holes are collinear with holes in the card immediately above it and the remaining half are collinear with the holes in the card immediately below it. Therefore at each successive card the holes are offset from those in the previous card in order to thread the screws into the sleeves. At a given level in a stack of circuit cards, the stand-offs for the next card are placed over the appropriate holes in the current card and the screws 28 are threaded up through the current card to secure the stand-offs. Thereafter, the current card is placed over the previous card's stand-offs and the screws 28 are threaded down through the current card to secure it to the stack.

Another type of stand-off is a sleeve that has an internally threaded (female) end and an externally threaded (male) end. At each successive level, the current card is placed over the supports for the previous cards, the male ends of which extend through the current card, and the female ends of the next set of sleeves are threaded onto the protruding male threads. The sleeves supporting the first and last cards are fastened to these cards by screws and nuts, respectively. In either case the interior supports, typically one or two at each level, effectively partition the circuit cards to reduce the sag and increase the resonant frequency, thereby reducing the cards' deflection.

Although stand-offs can provide adequate interior support, the assembly and disassembly of a stack of circuit cards using stand-offs can be very difficult and time consuming. The stand-offs are assembled by hand one at a time on each successive card in the stack, starting from the bottom. To remove a circuit card for repair or replacement, all of the cards and stand-offs subsequent the defective card must be disassembled one at a time, starting from the top card. After the defective card has been replaced, each successive card must be put back and their respective stand-offs reassembled. Another drawback to the sue of stand-offs is the possibility that a sleeve or screw may be dropped, causing an electrical short or requiring extensive disassembly to retrieve it.

Typically the physical structure that supports and houses the circuit cards is as small as possible and is tightly packed with circuit cards and other electrical components. In some applications it may be difficult for a technician to access the circuit cards to attach the standoffs, and it might be necessary to remove the entire housing or selected panels to gain access. From a packaging and structural integrity perspective, a unitary structure that is not disassembled and reassembled periodically is preferable. For example, the four side panels and backplane in the electronics module form a unitary structure. The circuit cards are slid through the respective card guides, plugged into the backplane and locked down. A cover can then be attached over the open end of the guide to encase the circuit cards. Assembling and disassembling the stand-offs in this type of structure while efficiently using all of the available space would be very difficult and time consuming. Therefore in conventional practice, standoffs are not used in conjunction with card guides. Thus, either the peripheral support provided by the card guide or the interior support provided by stand-offs are achieved, but not both.

SUMMARY OF THE INVENTION

The present invention seeks to provide interior circuit card supports and a method that facilitate fast and simple assembly and disassembly, and provide both peripheral and interior supports.

This is accomplished by providing a plurality of circuit cards, each having at least one interior hole and disposed substantially parallel to the other cards with the interior holes for the various cards collinear. A plurality of grommets are placed in the holes, with each grommet providing a first coupling. A rod that has a plurality of second couplings is inserted through the grommets such that the second couplings mate with the grommets' first couplings to provide interior support for the circuit cards. In the preferred embodiment, the grommets are internally threaded with a groove in line with the rod, which has deformable inserts that form an interference fit with the grommets' threads. The rod is inserted and then rotated such that the inserts deform and grip the grommet threads.

In another embodiment an electronics module is provided with a hole pattern in a panel that opposes the inserted circuit cards, which have matching grommet patterns. The guide's side panels are fitted with locking card guides that provide peripheral support for the circuits cards. Rods are inserted through the holes in the module, and are coupled to the grommets to provide the interior support.

For a better understanding of the invention, and to show how the same may be carried into effect, reference will now be made, by way of example, to the accompanying drawings.

DETAILED DESCRIPTION OF THE INVENTION

Figure 1:
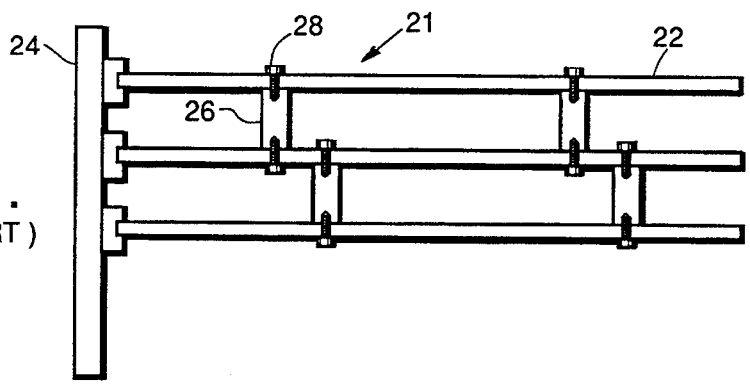
FIG. 1, described above, is a sectional view of a prior art technique for providing interior circuit card support using stand-offs.
Figure 2:
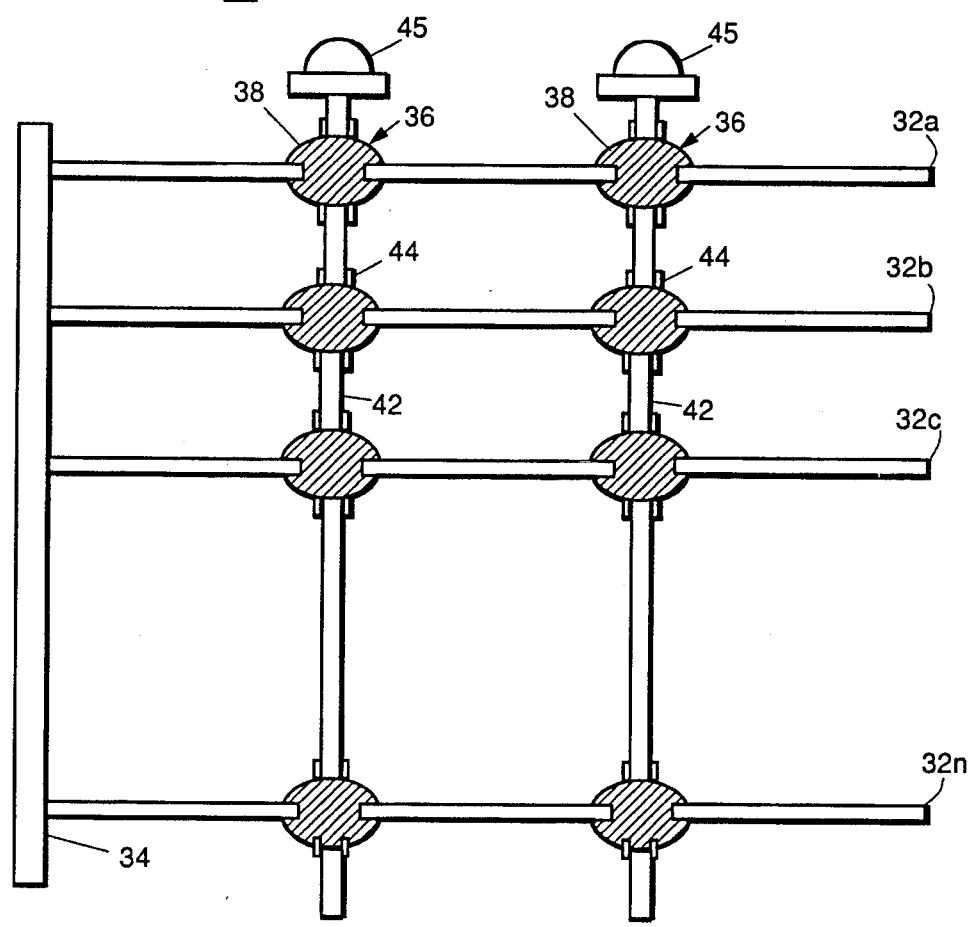
FIG. 2 is a sectional view of an embodiment of the invention for providing interior circuit card supports.
Figure 3:
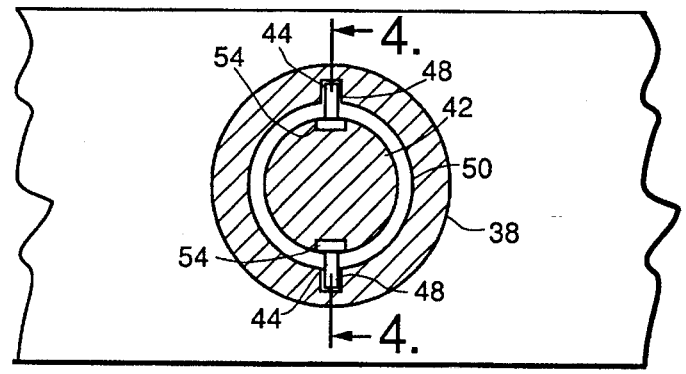
FIG. 3 is an plan view of a preferred embodiment for the grommet and rod.
Figure 4:
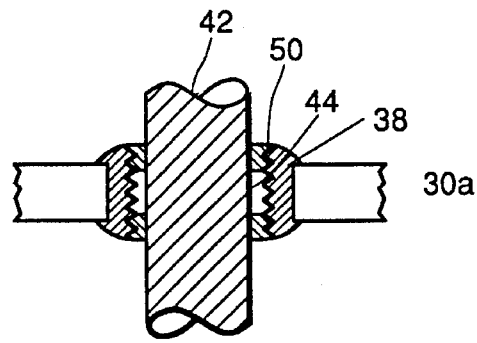
FIG. 4 is a sectional view of the preferred embodiment for the grommet and rod.

FIG. 2 is a sectional view of a plurality of circuit cards 32a through 32n that are plugged into a backplane 34. The circuit cards are stacked one above the other with a given separation. A pattern of one or more holes 36 are formed in each circuit card, with the holes of the different cards collinear. A plurality of grommets 38 are press fit in respective holes to provide a coupling mechanism between cards (details of which are shown in FIGS. 3–4). A number of rods 42, typically one or two, have tabs 44 that are spaced apart in accordance with the separation of the circuit cards, typically approximately 1.25–1.9 cm, and knobs 45 on their ends. After all of the cards have been plugged into the backplane, the rods are inserted through the collinear grommets until the tabs 44 are positioned inside, and possibly overlapping, respective grommets. The rods are then rotated by turning knobs 45, causing the tabs 44 to mate with the grommets' coupling mechanisms to lock the rods into place and provide interior structural supports. As a secondary effect, the rods also provide lateral support for the circuit cards. To remove any circuit card, the rods are counter-rotated to release them and pulled out of the grommets. After the card has been replaced, the rods are reinserted into the respective grommet holes and rotated to lock them into position.

FIG. 3 is a plan view of a preferred embodiment of the grommet 38 and the rod 42. FIG. 4 is a sectional view taken along section line AA of FIG. 3. The grommet 38 is internally threaded and has two grooves 48 that are cut into the threads 50 and extend along the grommet's entire length, 180° from each other. A single groove is adequate, but two grooves provide an improved connection. The rod 42 has two slots 54 at 180° from each other at each circuit card level. The rod tabs 44 are formed from a soft deformable plastic such as teflon, urethane or delrin AF and are held in place by being pressed into the rod's slots 54. The grommets are attached to respective cards so that their grooves are aligned to allow the lower tabs to pass through the upper grommets. For example, grommets such as a common ½–20 thread grommet with an inner diameter of 1.25 cm (½"), 20 threads per inch and a 0.075 cm thread depth could be positioned in respective holes with their grooves aligned parallel to the edges of respective cards. A suitable rod would have a 0.47 cm (3/16") diameter and teflon tabs that extend 0.15 cm from the rod to form a 0.075 cm interference fit with the grommet's threads.

To insert the rod 42, its tabs 44 are aligned with the grommet's grooves 48 in the top card and the rod is slid through the collinear grommets 38 such that its tabs are disposed in the grooves of respective grommets. The rod is then rotated, preferably by 90°, such that the tabs deform and grip the threads 50. The rod is removed by counter-rotating it by 90° to realign the tabs with the grooves and return them to their original shape, and pulling the rod out to dislodge the tabs from the grommets. In the preferred embodiment the required tolerance on the tabs' length and spacing along the length of the rod is fairly coarse; they're spaced at the separation of the cards with length sufficient to overlap a portion of the corresponding grommet. Alternatively the tabs can extend the entire length of the rod at 180° from each other.

Figure 5:
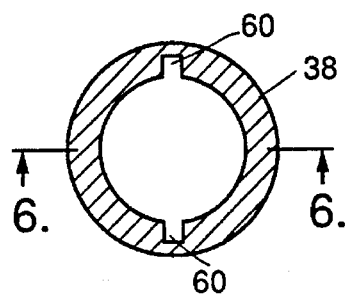
FIG. 5 is a plan view of an alternative grommet
Figure 6:
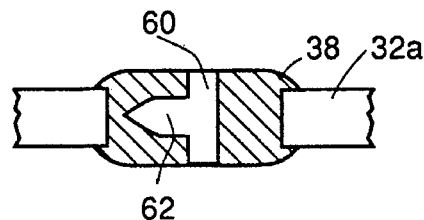
FIG. 6 is a sectional view of the alternative grommet.

FIG. 5 is a plan view of an alternative embodiment of the grommet 38. FIG. 6 is a sectional view taken along section line BB of FIG. 5. The grommet 38 has a first pair of grooves 60 that are formed in its inner surface and extend its entire length at 180° from each other. A second pair of tapered grooves 62 are cut around the grommet's inner surface, only one of these grooves is shown in FIG. 6, and intersect respective first grooves at a perpendicular angle. The deformable rod 42 tabs 44 shown in FIGS. 3 and 4 are inserted into the grommet by sliding them through the first grooves 60 to align the tabs are with the second grooves 62. The rod is then rotated to wedge the tabs into the tapered grooves and lock the rod into position. The tabs must fit into the second grooves, and the spacing between successive sets of tabs must be tightly controlled.

Figure 7:
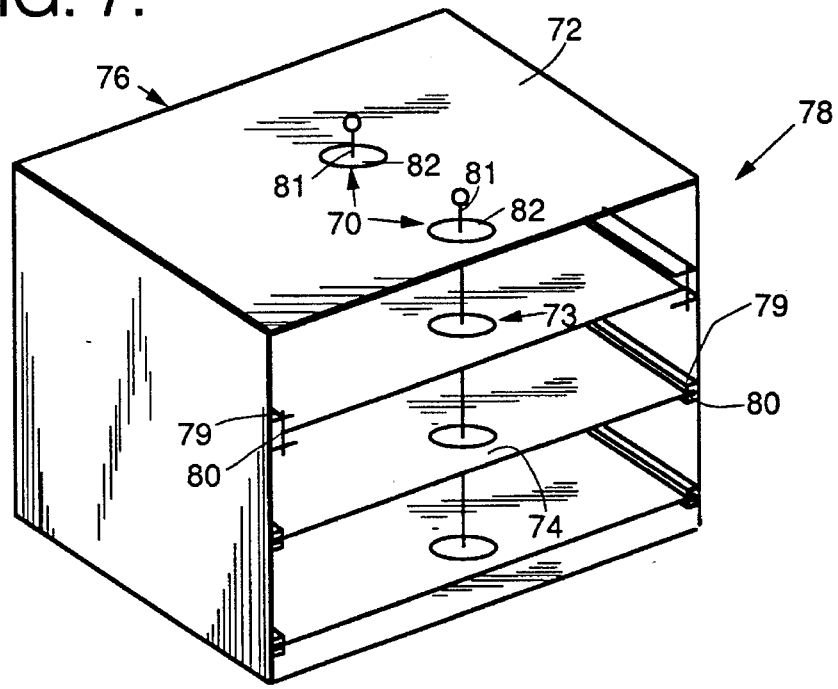
FIG. 7 is a perspective view of the invention applied to an electronics module for providing peripheral and interior support.

FIG. 7 is a perspective view of the invention as applied to an electronics module 68. The module, preferably the one discussed previously, is modified by drilling a hole pattern 70 in a top panel 72. The hole pattern 70 matches the hole/grommet pattern 73 formed in each of a plurality of circuit cards 74. The cards are inserted in any order into the module, plugged into a backplane 76 and locked down at their respective edges by locking card guides 78 such that the cards' hole/grommet patterns are collinear with hole pattern 70. The locking card guides for each card are suitably a pair of tracks 79 that support the circuit card on both sides and a pair of camshafts 80 that can be rotated to clasp the card's edges. Thereafter, a number of rods 81 having deformable tabs (not shown) and a stop 82 above the top most tab are inserted through the hole pattern 70 in module 68 until the stop 82 contacts the top panel 72 with the tabs positioned in respective grommets and rotated to lock the rods into place to provide interior support for the stack of circuit cards. Instead of the mechanical stop, alignment could be achieved by contacting the inserted end of the rod with the module's bottom panel. To remove any of the cards, the rods are simply counter-rotated and pulled out of the module. Once the card has been replaced, the rods are reinserted and rotated to relock the cards.

The invention provides a very efficient approach to providing interior structural support as well as peripheral support for a stack of circuit cards. The grommets are attached to each circuit card in a common pattern during the fabrication process but the rods are not inserted until after all of the circuit cards are in place; this is more efficient than assembling, by hand, separate stand-offs for sequential circuit cards. In the tight physical confines encountered in many applications, such as an electronics module, the rods can be inserted externally instead of requiring a technician to wedge his hand inside the structure and attempt to assemble the interior supports. Because the rods are relatively long, the chance of dropping one of them into the electronics is very small, and in the electronics module application in which they are inserted externally it is impossible. The primary advantage afforded by the inventive approach is in the ease and quickness of disassembling and reassembling the interior support structure.

While several illustrative embodiments of the invention have been shown and described, numerous variations and alternate embodiment will occur to those skilled in the art. Such variations and alternate embodiments are contemplated, and can be made without departing from the spirit and scope of the invention as defined in the appended claims. For example, the grommet could be replaced with an alternative coupling mechanism such as a pin formed on the surface of the circuit card and extending into the hole to engage the coupling mechanism on the rod.

I claim:

1. An interior support for a plurality of circuit cards, each card having at least one interior hole and positioned substantially parallel to the other cards with their respective holes collinear, comprising:

a plurality of first couplings in said holes; and a rod that includes a plurality of second couplings, said rod being insertable through said first couplings to mate said second couplings with respective first couplings to provide interior support between the circuit cards.

2. The interior support of claim 1, wherein said first couplings are grommets.

3. The interior support of claim 2, wherein said grommets are internally threaded and each has a groove that extends its full length, and said second couplings comprise deformable tabs that can be inserted into the grooves of respective grommets to provide interference fits with the grommets' threads, said rod being rotatable inside said grommets to cause said tabs to deform and grip said threads.

4. The interior support of claim 3, wherein the tabs are formed from teflon.

5. The interior support of claim 3, wherein said grommets each have two grooves at 180° from each other and said rod has two deformable tabs at 180° from each other.

6. The interior support of claim 2, wherein each of said grommets has a first groove that extends its full length and a second groove that intersects the first groove at a substantially perpendicular angle, said second couplings comprise tabs, said rod is insertable through the grommets and rotatable such that said tabs can rotate into the second groove of their respective grommets to secure said tabs and grommets against relative movement.

7. The interior support of claim 6, wherein said second grooves are tapered and said tabs are deformable such that rotating the rod wedges the tabs into the tapered second grooves.

8. A circuit card stack, comprising:

an electronics module having a hole pattern;

a plurality of circuit cards having a pattern of first couplings, said cards being insertable into said electronics module substantially parallel to each other such that the hole and first coupling patterns are collinear; and a plurality of rods having a plurality of second couplings, said rods being insertable through the module's holes and cards' first couplings to mate said second couplings with respective first couplings to provide interior support between the circuit cards.

9. The circuit card stack of claim 8, wherein said first couplings are grommets.

10. The circuit card stack of claim 8, wherein said circuit cards have first electrical connectors, and said electronics module comprises:

first and second opposing panels having respective card guide locking mechanisms for holding the cards' edges and providing peripheral support to said cards;

a third panel formed orthogonal to said first and second panels and having a plurality of second electrical connectors for receiving the cards' first electrical connectors; and a fourth panel formed orthogonal to said first, second and third panels and including said hole pattern.

11. The circuit card stack of claim 9, wherein said grommets are internally threaded and have grooves that extend their full lengths, and said second couplings comprise deformable tabs that are insertable into the grooves of respective grommets to provide an interference fit with the threads, said rod being rotatable to cause said tabs to deform and grip said threads.

12. A method for providing interior support for a plurality of circuit cards, comprising:

forming at least one hole in each circuit card at a location aligned with the hole of the other circuit cards;

securing a plurality of first couplings in said holes;

arranging the circuit cards substantially parallel to each other with their first couplings collinear;

inserting a rod that has a plurality of second couplings through said collinear first couplings; and mating said second couplings to said first couplings to provide interior spacing support between said cards.

13. The method of claim 12, wherein said first couplings are grommets.

14. A method of providing interior support for a plurality of circuit cards having first electrical connectors, comprising:

forming a hole in each circuit card at a location aligned with the hole of the other circuit cards;

securing a plurality of first couplings in said holes;

providing an electronics module that has a backplane with a plurality of second electrical connectors, opposing side panels having locking card guide mechanisms and a top panel with another hole;

inserting the circuit cards into said module through said locking card guide mechanisms to connect the first and second electrical connectors and align the cards' first couplings with the hole in the top panel;

locking said card guide mechanisms to provide peripheral support for the circuit cards;

inserting a rod having a plurality of second couplings through said collinear hole and first couplings with said second couplings aligned with the first couplings; and rotating said rods to mate said second couplings with said first couplings to provide interior support between said circuit cards.

15. The method of claim 14, wherein said first couplings are grommets.

* * * * *